United States Patent [19]

Graumann

[11] Patent Number: 4,684,892
[45] Date of Patent: Aug. 4, 1987

[54] NUCLEAR MAGNETIC RESONANCE APPARATUS

[75] Inventor: Rainer Graumann, Hoechstadt, Fed. Rep. of Germany

[73] Assignee: Siemens Aktiengesellschaft, Berlin and Munich, Fed. Rep. of Germany

[21] Appl. No.: 841,952

[22] Filed: Mar. 20, 1986

[30] Foreign Application Priority Data

Apr. 22, 1985 [DE] Fed. Rep. of Germany ....... 3514530

[51] Int. Cl.$^4$ ............................................. G01R 33/20
[52] U.S. Cl. ................................................. 324/309
[58] Field of Search ......................... 324/309; 128/653

[56] References Cited

U.S. PATENT DOCUMENTS

| 4,520,315 | 5/1985 | Loeffer et al. | 324/309 |
| 4,586,709 | 12/1984 | Bendall | 324/314 |
| 4,628,626 | 12/1986 | Maudsley | 324/309 |

FOREIGN PATENT DOCUMENTS

| 0127850 | 12/1984 | European Pat. Off. |   |
| 3006348 | 9/1980 | Fed. Rep. of Germany . |   |
| 3345209 | 6/1984 | Fed. Rep. of Germany . |   |
| 59-231438 | 12/1984 | Japan | 324/309 |
| 2126731 | 3/1984 | United Kingdom . |   |

OTHER PUBLICATIONS

Planar Spin Imaging by NMR, Mansfield et al, Journal of Magnetic Resonance, No. 1, Jul., 1977, pp. 107–114.
A new Pulse Sequence for "Fast Recovery Fast-Scan NMR Imaging," Iwaoka et al, IEEE Transactions on Medical Imaging, vol. MI-3, No. 1, Mar. 1984.
"Spin Echoes," Hahn, Physical Review, vol. 80, No. 4, Nov. 1950.

*Primary Examiner*—Stewart J. Levy
*Assistant Examiner*—Louis M. Arana
*Attorney, Agent, or Firm*—Hill, Van Santen, Steadman & Simpson

[57] ABSTRACT

A nuclear magnetic resonance apparatus for the examination of a subject has coils for respectively generating fundamental and gradient magnetic fields in which the examination subject is disposed, and a radio-frequency measurement unit which irradiates the examination subject with a sequence of radio-frequency pulses and which acquires the nuclear magnetic resonance signals emitted from the examination subject. The pulse sequences generated by the radio-frequency measurement unit are selected such that information for two differently emphasized spin-echo images and information for a $T_1$-emphasized image from a stimulated echo are acquired in one sequence.

2 Claims, 4 Drawing Figures

NUCLEAR MAGNETIC RESONANCE APPARATUS

BACKGROUND OF THE INVENTION

1. Field of the Invention

The invention relates to a nuclear resonance apparatus for examining a subject by nuclear magnetic resonance imaging having coils for applying fundamental and gradient fields to the examination subject and a radio-frequency means which irradiates the examination subject with a succession of radio-frequency pulses and which acquires the nuclear magnetic resonance signals emitted by the examination subject.

2. Description of the Prior Art

A nuclear magnetic resonance imaging system is described in German patent application No. P 31 35 335.5 which offers the possibility of deflecting the magnetic nuclear moments (nuclear spins) of an examination subject out of a preferred or equillibrium orientation with the assistance of a radio-frequency pulse, this preferred orientation being defined by a fundamental magnetic field. The frequency $\omega$ required for that purpose is defined via the equation $\omega_o = \gamma B_o$, wherein $\gamma$ is the gyromagnetic ratio (characteristic value for the atomic nuclei under consideration) and $B_o$ is the magnetic flux density of the fundamental field. After the radio-frequency field is removed, the system of the nuclear spins strives to return to the initial condition while emitting nuclear magnetic resonance signals. The strength of the measured resonance signal is proportional to the number of excited nuclear spins and thus provides information about the spin density of the examination subject.

When the atomic nuclei whose resonance is observed are present in various chemical linkage conditions, different resonant frequencies occur on the basis of the different local magnetic fields at the location of these nuclei. In this case, the intensity relationships of the associated resonant lines indicate the relative frequency with which the nuclei under consideration are present in the various linkage conditions.

In order to obtain a nuclear magnetic resonant signal not from the entire examination subject but only from a specific, prescribed volume region, only the nuclear spins in the volume region of interest are excited. Selection of this region (slices are usually selected) is achieved by superposition of a suitable gradient magnetic field over the fundamental field. Given the employment of a selective radio-frequency pulse, the inhomogeneous magnetic field resulting therefrom (for example, linearly rising in the Z-direction) only allows the excitation of those nuclei wherein the magnetic field has the value required for the above resonance condition (in the example, a slice perpendicular to the gradient direction (Z-direction)). In order to distinguish the contributions of the various nuclei to the resonance signal within an excited slice, the gradient field perpendicular to the slice is switched off after excitation has ensued and a field gradient whose direction lies in the slice plane (for example, X-direction) is provided instead. As a consequence of the different magnetic field strengths, the nuclei of the excited slice precess at different speeds and therefore emit resonance signals having different frequencies. The spectrum $S(\omega)$ and thus the frequency components of the signal can be obtained from the resultant received signal $S(t)$ by Fourier transformation ($S(t) \rightarrow S(\omega)$). On the basis of this frequency spectrum $S(\omega)$, thus, the various contributions of the nuclei to the signal can be assigned to the location of their generation on the basis of their frequency. In the example, all nuclei in a strip perpendicular to the X-direction contribute to the overall signal with the same frequency because these experience the same strength of the magnetic field. A projection of the spin density onto the direction of the switched gradient is thus obtained.

In order to be able to construct an image of the excited layer, the dependency of the resonance signal on the third spatial direction (in the example, the Y-direction) must be identified. To this end, (a) the above-described measurements can be repeated for may projection directions (suitable combinations of the X-gradient and Y-gradient) and a spin density image of the excited layer can be constructed from the acquired measured data by means of reverse projection, or (b) the two-dimensional measuring matrix registered with the assistance of the specific combinations of the X-gradient fields and Y-gradient fields can be subjected to a two-dimensional Fourier transformation.

The amplitude of the nuclear magnetic resonance signal emitted by the nuclei under consideration depends not only on the spin density of the excited region but also, among other things, depends on the spin-grid relaxation, spin-spin relaxation, and field inhomogeneities. The influences of the above parameters can be imaged in a simplifying gyro model wherein the nuclear spins of the examination subject are symbolized by rotating magnetic moments (gyro) in a fundamental magnetic field. The fundamental field should thereby be oriented in Z-direction. In this model, the alternating magnetic field of the excitation pulse influencing the nuclear spins of the examination suject rotates these out of the Z-direction by a defined angle (flip angle). In the case of a 90° pulse, all spins after the excitation lie within the X-Y plane in parallel alignment. The subsequent precessional motion of the magnetic moments is accompanied by (a) the spin-spin relaxation (interaction of the spins with one another leads to a decrease of the magnetization components in the X-Y plane (cross-magnetization) with the time constant $T_2$ in the framework of the above-described model);

(b) the spin-grid relaxation (interaction of the spins with the grid leads to a return of the magnetization into its initial condition parallel to the field with the time constant $T_1$);

(c) field inhomogeneities (effect a divergence of the gyroscope spin relation to the X-Y plane, this gyroscope spin precessing with different frequencies for this reason).

In general, $T_1 > T_2$ applies for the relaxation times $T_1$ and $T_2$. The amplitude of the signal (FID signal, free induction decay signal) emitted by the excited nuclei is defined, among other things, by the resulting magnetization component in the X-Y plane. Even more than the spin-spin relaxation, the dephasing of the spin caused by the field inhomogeneities effects the decrease of these components. The decrease in cross-magnetization caused by both processes is often described with the time constant $T_2^*$.

Since the dephasing caused by field inhomogeneities has a rigidly prescribed time behaviour for every location, this process can be largely reversed by means of suitable measured (refocussing, for example by means of a ±180° radio-frequency pulse).

An increase of the amplitude of the resonance signal to a maximum (spin echo) at which the dephasing caused by field inhomogeneity is largely compensated and, finally, a renewed decrease of the amplitude with the time constant $T_2^*$ due to the renewed dephasing can be observed. This focussing process can be repeatedly applied (for example by a sequence of $\pm 180°$ pulses) and leads to further echoes. The chronological decrease in the strength (maximal amplitudes) of these echoes therefore provides information regarding the relaxation constant $T_2$.

The above spin-echo method uses a pulse sequence as shown in FIG. 1. After the FID signal 20 of the first $\pm 90°$ pulse has decayed, the refocussing is initiated by the first $\pm 180°$ pulse. A maximum focussing (maximal amplitude of the first spin echo 23) is reached after the time $2\tau$ (calculated from the point in time of the first $\pm 90°$ pulse. The dephasing occurring thereafter is again reversed into a refocussing due to a further $\pm 180°$ pulse. A second spin echo 25 arises at point in time $4\tau$ due to the refocussing, but this has a lower maximal amplitude since the chronologically irreversible spin-spin interactions arising in the interim cause a decrease of the magnetization in the X-Y plane. The next pulse sequence begins with a $\pm 90°$ pulse after a time $T_R$.

The chronological curve of the first echo signal 23 is stored as S1(t) by the nuclear magnetic resonance apparatus and represents a line of a two-dimensional measuring matrix. Accordingly, the stored signal S2(t) of the second echo 25 likewise forms a line of a second two-dimensional measuring matrix. Other lines of the two measuring matrices are read in with every sequence given a corresponding selection of the gradient fields. In the case of image reconstruction according to method (b) above, each of the complete measuring matrices thus obtained is coverted into a result image by means of a two-dimensional Fourier transformation.

FIG. 2 shows a pulse sequence as employed in the "inversion recovery" method. This pulse sequence is identical to the spin-echo sequence except for a preceeding $\pm 180°$ pulse. In combination with the selection of a defined time difference I, this pulse effects a greater $T_1$ emphasis of the images acquired in this way from the spin echoes 30 and 31.

So-called stimulated echoes occur upon employment of pulse sequences having three or more RF pulses, these stimulated echoes being caused by the Z-component of the magnetization present after the second 90° pulse given a pulse sequence having three successive 90° pulses.

Methods wherein stimulated echo signals are generated were initially described in the publication by E. L. Hahn, "Phys. Rev." 80 (1950), pp. 580-594. Since the information contained in the stimulated echo signal can also be evaluated for the imaging nuclear magnetic resonance, an object of the present invention is to generate this stimulated echo within a pulse sequence and to employ the echo information, for example, to produce an additional $T_1$-emphasized image.

Since the spin density $\rho$ and the relaxation times $T_1$ and $T_2$ are important parameters in MR imaging in tissue diagnosis, there is a need to obtain as much information as possible regarding these parameters in a short time. In conventional imaging systems, different $T_1$-emphasized and $T_2$-emphasized images could not be acquired in a sequence. The only possibility was to obtain the desired information in a plurality of measuring sequences.

SUMMARY OF THE INVENTION

An object of the invention is to obtain information for a $T_1$ emphasized image and a $T_2$ emphasized spin-echo image in addition to the information for a traditional spin-echo image in one measuring sequence without lengthening the measuring time.

This object is achieved in accord with the invention in that radio-frequency means are provided such that the radio-frequency pulses generated thereby and the resulting echoes generated by the radio-frequency pulses occur within a sequence in the following chronological succession:

(a) Radio-frequency pulse having a flip angle of about $\pm 90°$ at point in time O, (b) Radio-frequency pulse having a flip angle of about $\pm 180°$ at point in time $\tau$, (c) $\pm 180°$ spin-echo (40) at point in time $2\tau$, (d) Radio-frequency pulse having a flip angle of about $\pm 90°$ at point in time $3\tau$, (e) $\pm 90°$ spin-echo (41) at point in time $4\tau$, (f) Radio-frequency pulse having a flip angle of about $\pm 90°$ at a point in time $3\tau + \Delta$, and (g) Stimulated echo (42) at point in time $4\tau + \Delta$.

This pulse sequence enables the registration of three images having respectively different information content. These images are the known spin-echo image from the traditional sequences, a $T_2$-emphasized spin-echo image and a $T_1$-emphasized image (from the stimulated echo).

DESCRIPTION OF THE PREFERRED EMBODIMENTS

Figure 3:
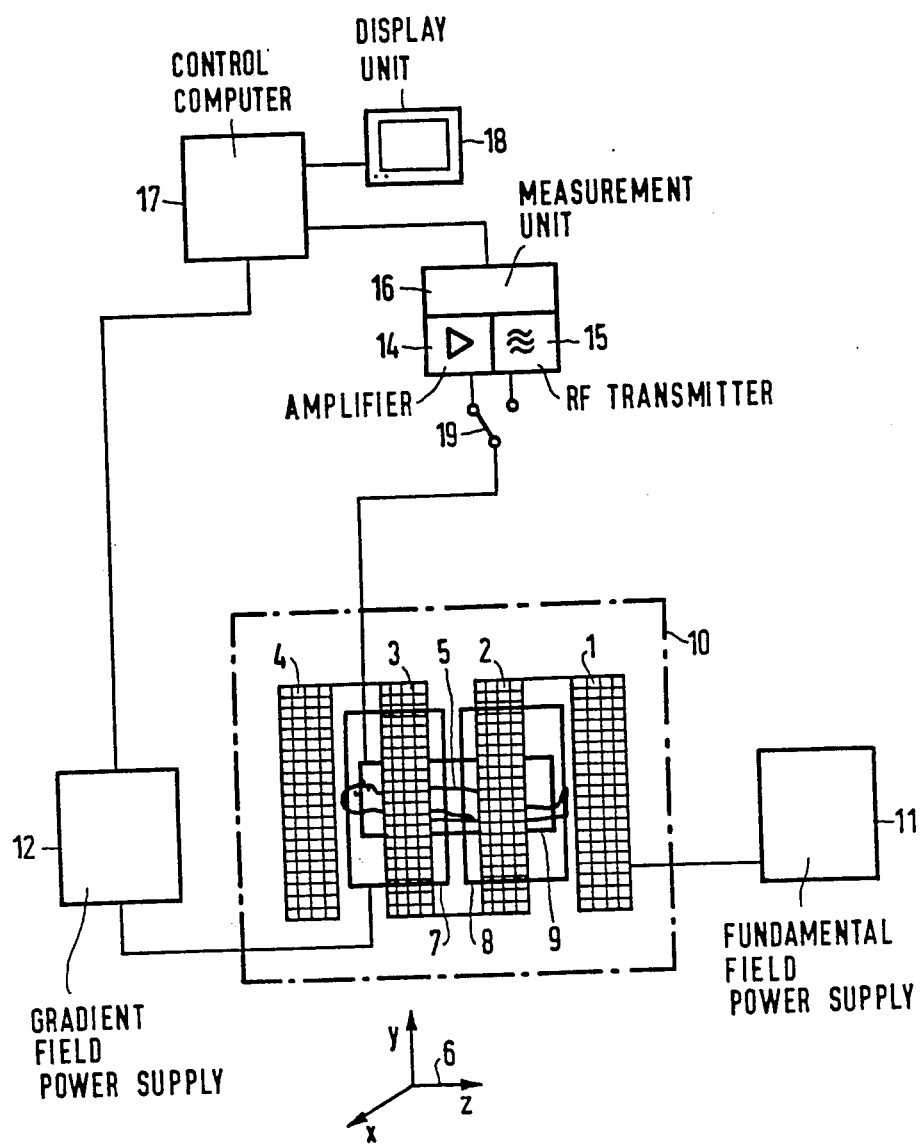
FIG. 3 is a block circuit diagram of a nuclear magnetic resonance apparatus constructed in accordance with the principles of the present invention.

In FIG. 3, coils 1, 2, 3 and 4 generate a fundamental magnetic field $B_o$ in which a patient 5 to be examined is situated for medical diagnosis. Gradient coils are also provided for generating independent, mutually perpendicular magnetic field gradients of the directions X, Y and Z in accord with the convention referenced at 6. For clarity, only gradient coils 7 and 8 are shown in the figure, these serving to generate the X-gradient together with a pair of identical gradient coils lying opposite thereto (not shown). The identical Y-gradient coils (not shown) lie parallel above and below the patient 5 and those for the Z-gradient field lie at the head and at the feet transversely relative to the longitudinal axis of the patient 5. The arrangement also includes a coil 9 for the generation and registration of the nuclear magnetic resonance signals.

The coils 1 through 9 bounded by a dot-dash line 10 represent the actual examination instrument. It is operated from an electrical arrangement which includes a power supply 11 for the operation of the coils 1 through 4 as well as a gradient power supply 12 to which the gradient coils 7 and 8 as well as the further gradient coils are connected. The measuring coil 9 is connected to a process-control computer 17 through either a signal amplifier 14 or a radio-frequency transmitter 15. A CRT device 18 is supplied for displaying the image. The components 14 and 15 form a radio-frequency measuring unit 16 for signal generation and registration. A switching element 19 enables switching from the transmit to the receive mode.

Figure 1:
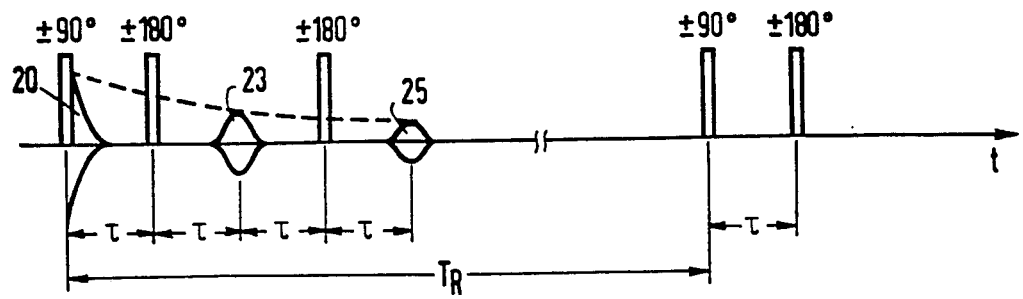
FIG. 1 is a pulse sequence for the known spin-echo imaging method.
Figure 2:
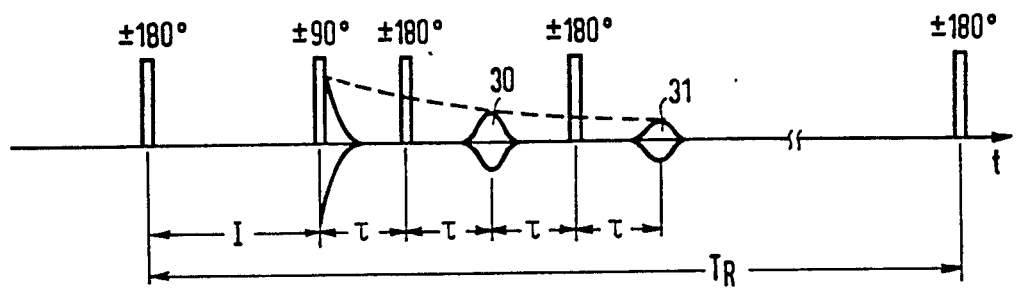
FIG. 2 is a pulse sequence for the known inversion recovery imaging method.
Figure 4:
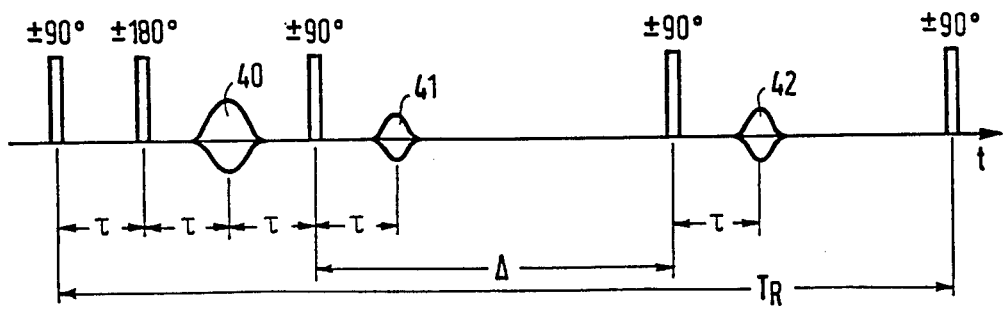
FIG. 4 is a pulse sequence for the apparatus shown in FIG. 3.

FIG. 4 shows the echo signals occuring given the pulse sequence of the invention in that case when a ±90° pulse is employed as fourth radio-frequency pulse. The spin echo 40 known from conventional sequences arises following the ±180° pulse, having the amplitude $$S_1 \sim \rho \cdot \exp(-2\tau/T_2) \cdot \underbrace{(1 - \exp(-(T_R - \Delta - 3\tau)/T_1))}_{F}$$

The 90° spin echo 41 has the maximum amplitude $$S_2 \sim (\rho/2) \cdot \exp(-4\tau/T_2) \cdot F$$

and supplies information for a $T_2$-emphasized image. After the time $4\tau + \Delta$, a stimulated echo arises following the fourth radio-frequency pulse, having the maximum amplitude $$S_3 \sim (\rho/2) \cdot \exp(-4\mu g_2) \cdot \exp(-\Delta/T_1) \cdot F,$$

containing information for a $T_1$-emphasized image. The information acquired from the echoes 40, 41, 42 allows identification of the $T_1$ and $T_2$ relaxation constants in one sequence. Since the additionally acquired information is acquired together with the spin echo information in one sequence, no lengthening of the measuring time is necessary in comparison to the conventional spin echo method. The object stated above is thus achieved by the four-pulse sequence of the invention.

A meaningful development of the pulse sequence set forth is achieved, for example, by attaching a series of ±180° pulses which can supply further information for $T_2$-emphasized images.

When, in step (f), a pulse having a flip angle $\alpha$ is employed instead of the pulse having the flip angle ±90°, whereby $|\alpha|$ is less than 90°, then only a fraction of the stimulated echo signal is read-out following this pulse (partial read-out pulse). With the assistance of an expansion of the sequence by attaching further partially read-out pulses, additional information for images having different $T_1$ emphasis can in turn be acquired.

Finally, additional images can be generated by combining all of the information acquired by the sequence of the invention.

Although modifications and changes may be suggested by those skilled in the art it is the intention of the inventor to embody within the patent warranted hereon all changes and moditications as reasonably and properly come within the scope of their contribution to the art.

I claim as my invention:

1. A nuclear magnetic resonance apparatus for examining a subject comprising:
   means for generating a fundamental magnetic field in which said subject is disposed;
   means for generating a plurality of gradient fields in mutually perpendicular planes in which said subject is disposed; and
   means for generating selected sequences of RF pulses irradiating selected portions of said subject and for receiving spin-echo from said subject caused by said RF pulses in a chronological succession of
   (a) an RF pulse having a flip angle of about ±90° at a point in time O;
   (b) an RF pulse having a flip angle of about ±180° at a point in time $\tau$,
   (c) a ±180° spin echo at a point in time $2\tau$;
   (d) an RF pulse having a flip angle of about ±90° at a point in time $3\tau$;
   (e) a ±90° spin echo at a point in time $4\tau$;
   (f) at least one RF pulse having a flip angle of at most about ±90° at a point in time $3\tau + \Delta$ and
   (g) a stimulated echo at a point in time $4\tau + \Delta$.

2. A nuclear magnetic resonance apparatus as claimed in claim 1 further defined by said means for generating selected sequences generating at time $3\tau + \Delta$ at least one pulse having a flip angle $\alpha$, where $|\alpha|$ is less than 90°.

* * * * *